United States Patent
Okunuki

(10) Patent No.: US 7,075,324 B2
(45) Date of Patent: Jul. 11, 2006

(54) METHOD AND DEVICE FOR TESTING SEMICONDUCTOR LASER

(75) Inventor: Yuichiro Okunuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 22 days.

(21) Appl. No.: 10/917,306

(22) Filed: Aug. 13, 2004

(65) Prior Publication Data

US 2005/0164415 A1 Jul. 28, 2005

(30) Foreign Application Priority Data

Jan. 28, 2004 (JP) ............................. 2004-019699

(51) Int. Cl.
G01R 31/26 (2006.01)
G01R 23/16 (2006.01)
H01S 3/00 (2006.01)

(52) U.S. Cl. .................. 324/765; 324/76.22; 702/76; 372/96

(58) Field of Classification Search ............ 324/95–97; 356/73.1, 303, 451; 438/16; 372/96, 50.11; 398/26, 33
See application file for complete search history.

(56) References Cited

U.S. PATENT DOCUMENTS

| 5,077,752 A | * | 12/1991 | Tada et al. ............... 372/96 |
| 5,289,114 A | * | 2/1994 | Nakamura et al. ....... 324/96 |
| 5,960,023 A | * | 9/1999 | Takahashi ............... 372/96 |
| 6,026,105 A | * | 2/2000 | Sheridan-Eng .......... 372/43.01 |
| 2003/0072344 A1 | * | 4/2003 | Lam et al. ............... 372/50 |

FOREIGN PATENT DOCUMENTS

DE 3802841 A1 * 8/1989
JP 63-55432 * 3/1988

OTHER PUBLICATIONS

Kawano et al. Semiconductor Laser Checking Method, 06-436, English Translation of Japanese Kokai Patent Application No. Sho 63[1988]-55432.*
Huang, Y. et al., "Isolator-Free 2.5-Gb's 80-km Transmission by Directly Modulated λ/8 Phase-Shifted DFB-LDs Under Negative Feedback Effect of Mirror Loss", IEEE Photonics Technology Letters, vol. 13, No. 3, Mar. 2001, pp. 245-247.
Numai, T, "Fundamentals of Semiconductor laser engineering", Maruzen Co., Ltd., pp. 167-170.
Huang, Y et al., "Isolator-Free 2.5-Gb's 80-sm Transmission by Directly Modulated λ/8 Phase-Shifted DFB-LDs Under Negative Feedback Effect of Mirror Loss", IEEE Photonics Technology Letters, vol. 13, No. 3, Mar. 2001, pp. 245-247.

* cited by examiner

Primary Examiner—Anjan Deb
(74) Attorney, Agent, or Firm—McDermott Will & Emery LLP

(57) ABSTRACT

In testing a distributed feedback semiconductor laser with a grating having a phase shift part, a spectrum of the distributed feedback semiconductor laser is measured. A difference between an intensity of a side mode at a high-frequency-wave side of a main mode and an intensity of a side mode at a low-frequency-wave side of the main mode is calculated. The distributed feedback semiconductor laser is judged non-defective when the difference is more than a certain value.

2 Claims, 1 Drawing Sheet

METHOD AND DEVICE FOR TESTING SEMICONDUCTOR LASER

BACKGROUND OF THE INVENTION

1. Field of the Invention

The present invention relates to a method and device for testing a semiconductor laser used for, for example, optical fiber communications, and more particularly to a method and device for testing a distributed feedback semiconductor laser having a phase shift diffraction grating.

2. Background Art

Distributed feedback semiconductor lasers have hitherto been frequently used for optical fiber communications due to its capability in realizing single longitudinal mode oscillation. Above all, distributed feedback semiconductor lasers which have λ/4 phase shift diffraction grating having a phase shift part corresponding to the quarter wavelength in a part of the diffraction grating are in heavy usage in the high-speed optical communication field due to its high yield and excellent stability in single longitudinal mode oscillation (for example, refer to T. Numai, "Fundamentals of Semiconductor Laser Engineering", pp. 167–170, published 1996 by Maruzen Co., Ltd.).

In optical fiber communications and especially in long-distance optical fiber communications, a light having a wavelength equal to a band of 1.55 μm is used. This is because 1.55 μm is the wavelength at which least absorption loss of light occurs in an optical fiber.

However, in the band of 1.55 μm, the wavelength dependence of the refractive index of the optical fiber is large compared with other bands of light. This means that the speed of light in the optical fiber has a wavelength dependence.

Generally, if a modulation current is applied to a semiconductor laser, a change in the oscillation wavelength called 'chirping' occurs. In the case where the wavelength of the laser changes dynamically according to the chirping, the time of arrival of signal light shifts because of the above-mentioned wavelength and dependence, and deformation in modulating signal waveform occurs. The degree of deformation becomes more drastic as the transmission distance becomes longer, and this disables the signal to be read accurately at the receiving side. For this reason, the transmission distance is limited by the chirping.

Chirping occurs on the principle mentioned below. At the time of modulation of the laser, the carrier density inside the laser changes. Due to the change in carrier density, a change in the refractive index occurs (this phenomenon is known as 'plasma effect').

On the other hand, the oscillation wavelength of the distributed feedback laser is practically defined by the wavelength λ which satisfies the Bragg condition. Here, the following formula may be given:

$$\lambda = 2 \times n \times m \times \Lambda \quad (1)$$

where: n is the refractive index, m is an integer not smaller than one, and Λ is the period of the grating. Accordingly, it may be understood with facility that the wavelength changes depending on the change in the refractive index. The wavelength of the laser changes at modulation on this principle.

It is known that the amount of chirping depends on the amount of phase shift in the distributed feedback laser (for example, refer to Y. Huang et al., "Isolator-Free 2.5-Gb/s 80-km Transmission by Directly Modulated λ/8 Phase-Shifted DFB-LDs Under Negative Feedback Effect of Mirror Loss", IEEE Photonics Technology Letters, vol. 13, No. 3, pp. 245–247).

The amount of phase shift is normally set at quarter wavelength (½ of the grating period) for stable single longitudinal mode oscillation, however, since the grating period is as small as 0.2 to 0.25 μm, in the actual element-manufacturing process, the phase shift amount deviates from the original design value λ/4, and a variation occurs. As a result of this, a variation occurs also in the amount of chirping among the elements, and to guarantee the transmission characteristics of the elements, it is necessary to conduct a 100% test.

The transmission characteristics of an element are generally dealt with using a parameter called 'power penalty'. Upon guaranteeing the transmission characteristics of a semiconductor laser product, in most cases, the standard is set based on the value of the power penalty. Power penalty is a parameter for indicating the degree of deformation of modulating signal waveform, and is defined by the difference of receiver sensitivity (input optical power to the receiver) that is necessary for realizing the given code error rate in the specified transmission distance and in 0 km.

Accordingly, to test characteristics of transmission to elements means to measure power penalty, i.e., to measure the code error rate before and after transmission while varying the input optical power to the receiver.

SUMMARY OF THE INVENTION

Since the conventional method of testing of semiconductor lasers is as aforementioned, a long time is necessary for testing the transmission characteristics of the elements. The reason for this is because a lot of time is required for measuring the code error rate. A lot of time is needed for counting code errors, which occur randomly.

For example, about 15 to 20 minutes per element are required to measure the power penalty when the transmission speed is 2.5 Gbps and the code error rate defining the power penalty is $10^{-10}$. This time is extremely long for testing a semiconductor laser, and creates problems such as increase in manufacturing term and testing cost.

The present invention has been devised to solve problems as mentioned above, and has as its intention the provision of a method for testing the transmission characteristics of elements in an extremely short time, and a testing device suitable for this testing method.

In testing a distributed feedback semiconductor laser with a grating having a phase shift part according to the present invention, a spectrum of the distributed feedback semiconductor laser is measured. A difference between an intensity of a side mode at a high-frequency-wave side of a main mode and an intensity of a side mode at a low-frequency-wave side of the main mode is calculated. The distributed feedback semiconductor laser is judged non-defective when the difference is more than a certain value.

Since the method for testing a semiconductor laser according to the present invention is as described above, it is possible to complete testing in an extremely short time (about 10 seconds) compared with the conventional power penalty testing. Thus, the method for testing a semiconductor laser according to the present invention is useful in reducing manufacturing term and manufacturing cost.

These and other objects, features, and advantages of the present invention will become more apparent in light of the following detailed description thereof, as illustrated in the accompanying drawings.

DETAILED DESCRIPTION OF THE PREFERRED EMBODIMENTS

Figure 1:
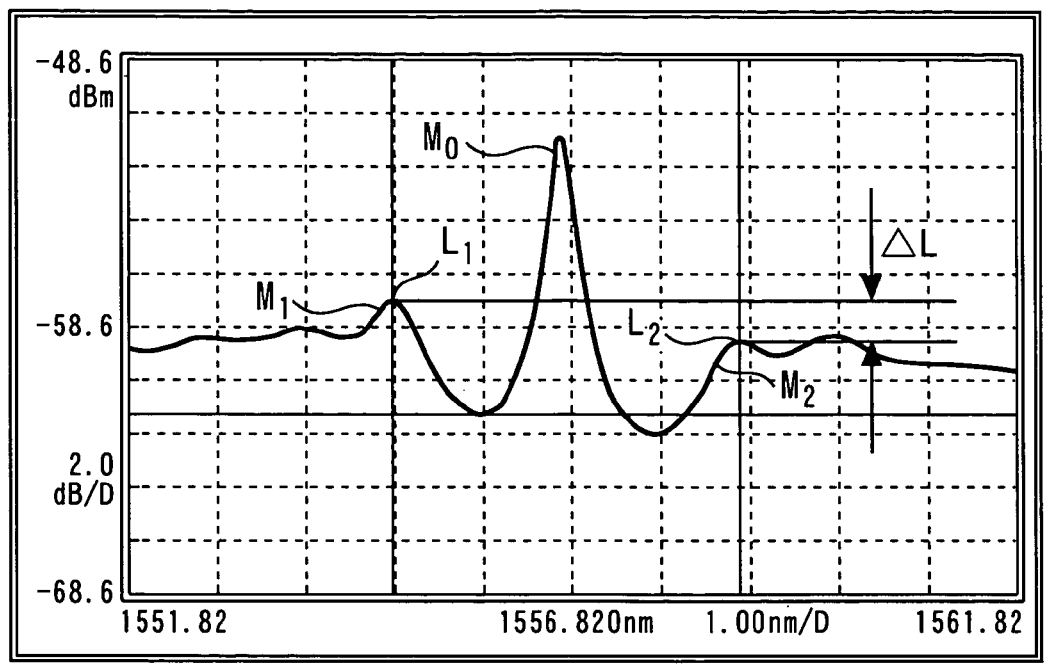
FIG. 1 is a spectral map for explaining the structure of a first embodiment of the present invention.

The following is an explanation of a first embodiment based on the drawings. FIG. 1 represents an example of a spectral map for explaining the structure of the first embodiment, and represents an example of a spectral map of a $\lambda/4$ phase shift diffraction grating laser. The horizontal axis represents the wavelength, and the vertical axis represents the intensity of the laser light.

In this spectral map, the spectrum in the case where the current applied to the laser is set to be 0.9 times of the current of the oscillation threshold value.

$L_1$ is the peak intensity of the side mode $M_1$ at the high-frequency-wave side of the main mode $M_0$ of the spectrum, and $L_2$ is the peak intensity of the side mode $M_2$ at the low-frequency-wave side of the main mode $M_0$. The difference $\Delta L = L_1 - L_2$ between the peak intensities is calculated.

Figure 2:
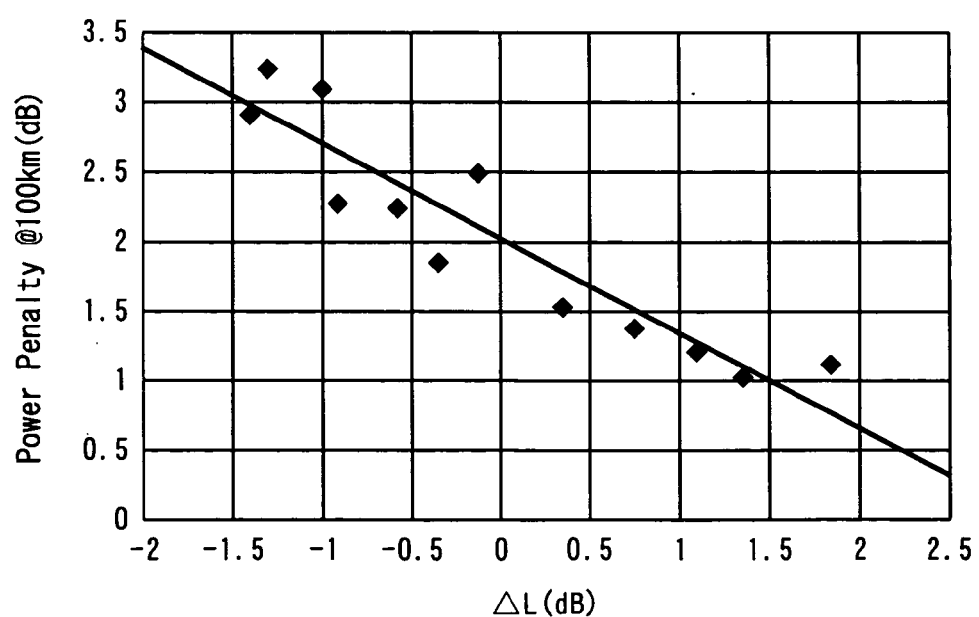
FIG. 2 is a graph representing the correlation between $\Delta L$ and power penalty in the first embodiment of the present invention.

It is found that the calculated $\Delta L$ and the power penalty correlate with each other as shown in FIG. 2. The cause of this correlation is the deviation from the above-mentioned phase shift amount $\lambda/4$. If the phase shift amount is exactly $\lambda/4$, $\Delta L$ equals zero, however, if the phase shift amount is smaller than $\lambda/4$, $\Delta L$ becomes larger than zero, and if the phase shift amount is larger than $\lambda/4$ $\Delta L$ becomes smaller than zero. This may be derived from a comparatively easy calculation.

$\Delta L$ may be measured by making the semiconductor laser emit light and collecting the light in an optical fiber by means of a lens or the like, and inputting the optical fiber to an optical spectrum analyzer.

In the case where the semiconductor laser is packaged in a module, measurement may be carried out by just inputting the output from the module to the optical spectrum analyzer. In the example shown in FIG. 1 and FIG. 2, the current applied to the laser is set to be 0.9 times of the current of the oscillation threshold value, however, since the correlation shown in FIG. 2 is realized even if the current exceeds the threshold-value current, as for the embodiment of testing according to the First Embodiment, even if the current exceeds the threshold-value current, it would not create a problem.

The power penalty, which is a parameter indicating the quality of transmission characteristics, is often required to be lower than a prescribed value, generally not more than 2 dB. Accordingly, in FIG. 2, for example, it is possible to substitute testing of power penalty i.e., transmission characteristics by judging as non-defective semiconductor lasers in the area of $\Delta L$ in which the power penalty is 2 dB or lower.

Since the testing of the above-mentioned $\Delta L$ is completed in an extremely short time (about 10 seconds) compared with the conventional power penalty test (measurement time: more than 15 minutes), it is useful in reducing manufacturing term and manufacturing cost.

Since the conventional optical spectrum analyzer is not provided with a function for calculating $\Delta L$, by realizing an optical spectrum analyzer with this function, a simple spectrum testing device may be realized.

To be more precise, an optical spectrum analyzer which calculates $\Delta L$ with a calculating function of a testing device by automatically detecting the peak intensities $L_1$ and $L_2$ of the main mode's two side modes—$L_1$ at the high-frequency-wave side, and $L_2$ at the low-frequency-wave side—respectively, would be effective.

Furthermore, it is also possible to calculate $\Delta L$ by connecting a conventional optical spectrum analyzer to a computer, and transferring and calculating the measured data with the computer instead of providing the optical spectrum analyzer with a calculating function to calculate $\Delta L$.

It is also possible to test the power penalty by means of an assay system as mentioned above, and the same effects as when an optical spectrum analyzer provided with an function to calculate the aforementioned $\Delta L$ is employed may be obtained.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2004-019699, filed on Jan. 28, 2004 including specification, claims, drawings and summary, on which the Convention priority of the present application is based, are incorporated herein by reference in its entirety.

What is claimed is:

1. A method of testing a semiconductor laser which is a distributed feedback semiconductor laser with a grating having a phase shift part, comprising the steps of:
   measuring a spectrum of the distributed feedback semiconductor laser to detect an intensity of a side mode at a high-frequency-wave side of a main mode and an intensity of a side mode at a low-frequency-wave side of the main mode;
   calculating a difference between the intensity of the side mode at the high-frequency-wave side of the main mode and the intensity of the side mode at the low-frequency-wave side of the main mode; and
   judging that the distributed feedback semiconductor laser is non-defective when the difference is more than a certain value.

2. A device for testing a semiconductor laser which is a distributed feedback semiconductor laser testing device with a grating having a phase shift part, comprising:
   measuring means for measuring a spectrum of the distributed feedback semiconductor laser to detect an intensity of a side mode at a high-frequency-wave side of a main mode and an intensity of a side mode at a low-frequency-wave side of the main mode;
   calculating means for calculating a difference between the intensity of the side mode at the high-frequency-wave side of the main mode and the intensity of the side mode at the low-frequency-wave side of the main mode; and
   judging means for judging that the distributed feedback semiconductor laser is non-defective when the difference is more than a certain value.

* * * * *